United States Patent
Hayashi et al.

(10) Patent No.: US 8,678,562 B2
(45) Date of Patent: Mar. 25, 2014

(54) PIEZOELECTRIC MATERIAL, PIEZOELECTRIC DEVICE, LIQUID DISCHARGE HEAD, AND ULTRASONIC MOTOR

(75) Inventors: Jumpei Hayashi, Chofu (JP); Takayuki Watanabe, Yokohama (JP); Takanori Matsuda, Chofu (JP); Kaoru Miura, Matsudo (JP); Makoto Kubota, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/395,996

(22) PCT Filed: Sep. 28, 2010

(86) PCT No.: PCT/JP2010/067324
§ 371 (c)(1),
(2), (4) Date: Mar. 14, 2012

(87) PCT Pub. No.: WO2011/040630
PCT Pub. Date: Apr. 7, 2011

(65) Prior Publication Data
US 2012/0162319 A1     Jun. 28, 2012

(30) Foreign Application Priority Data
Sep. 30, 2009    (JP) ................................ 2009-228408

(51) Int. Cl.
    H01L 41/00     (2013.01)
    H02N 2/00     (2006.01)
    B41J 2/045     (2006.01)

(52) U.S. Cl.
    USPC ........................................ 347/68; 310/311

(58) Field of Classification Search
    None
    See application file for complete search history.

(56) References Cited

U.S. PATENT DOCUMENTS

2007/0216264 A1    9/2007   Furukawa et al.
2010/0025618 A1*   2/2010   Watanabe et al. ........ 252/62.9 R
(Continued)

FOREIGN PATENT DOCUMENTS

| CN | 101043066 A | 9/2007 |
|---|---|---|
| JP | 2001-072466 A | 3/2001 |
| JP | 2004-075448 A | 3/2004 |
| JP | 2006-151796 A | 6/2006 |

OTHER PUBLICATIONS

Notice of Preliminary Rejection in Korean Application No. 10-2012-7010226 (dated Jun. 28, 2013).

(Continued)

*Primary Examiner* — Matthew Luu
*Assistant Examiner* — Erica Lin
(74) *Attorney, Agent, or Firm* — Fitzpatrick, Cella, Harper & Scinto

(57) ABSTRACT

Provided is a piezoelectric material including a bismuth barium niobium oxide-based tungsten bronze structure metal oxide having a high Curie temperature and being excellent in piezoelectric property. The piezoelectric material includes a metal oxide having a tungsten bronze structure represented by the following general formula (1), in which the metal oxide having a tungsten bronze structure includes Li, and a content of the Li is 0.015 weight percent or more and 0.600 weight percent or less in terms of metal with respect to 100 parts by weight of the metal oxide:

$$A_x B_{10} O_{30} \qquad (1)$$

where A represents Ba and Bi, or at least one kind or more of elements selected from the group consisting of: Na, Sr, and Ca in addition to Ba and Bi; B represents Nb, or Nb and Ta; and x represents a numerical value of $4.5 < x < 5.5$.

11 Claims, 3 Drawing Sheets

(56) References Cited

U.S. PATENT DOCUMENTS

| | | |
|---|---|---|
| 2010/0155646 A1 | 6/2010 | Furuta et al. |
| 2011/0193451 A1 | 8/2011 | Watanabe et al. |
| 2011/0297870 A1 | 12/2011 | Matsuda et al. |
| 2011/0298336 A1 | 12/2011 | Saito et al. |

OTHER PUBLICATIONS

Tokuko Sugai, "Ferroelectric Crystal of $Ba_2Bi_{1/3}Nb_5O_{15}$," 26(5) Jpn. J. Appl. Phys. 778-779 (May 1987).

Liang Fang et al., "Synthesis and Dielectric Properties of $Ba_3NaBiNb_{10}O_{30}$ Ceramics," 18(1) Journal of Wuhan University of Technology—Mater. Sci. Ed. 22-24 (Mar. 2003).

A. Simon et al., "Lead-free Relaxors with "TTB" Strucuture Containing Either Lanthanum or Bismuth," 199(3) Phys. Stat. Sol. (a) 541-545 (Oct. 14, 2003).

First Office Action in Chinese Application No. 201080043224.0 (dated Oct. 9, 2013).

Fang Liang et al., "Structrual and Dielectric Properties of a Niobate $Ba_3NaBiNb_{10}O_{30}$", 17(5) Acta Phys. Chim. Sin. 457-459 (May 2001).

\* cited by examiner

PIEZOELECTRIC MATERIAL, PIEZOELECTRIC DEVICE, LIQUID DISCHARGE HEAD, AND ULTRASONIC MOTOR

TECHNICAL FIELD

The present invention relates to a piezoelectric material, in particular, a piezoelectric material that does not contain lead. The present invention also relates to a piezoelectric device, a liquid discharge head, and an ultrasonic motor using the piezoelectric material.

BACKGROUND ART

Most of piezoelectric materials, which are used for various piezoelectric devices, are lead zirconate titanate. Attempts have been made to substitute those piezoelectric materials that contain lead with a piezoelectric material that does not contain lead (lead-free piezoelectric material). This is because, it has been pointed out a risk of doing harm to an ecosystem, because a lead component within the piezoelectric material starts to dissolve into soil, if a piezoelectric device that contains lead is once disposed and exposed to acid rain. For this reason, there is proposed a lead-free piezoelectric material.

As the lead-free piezoelectric materials, there are well known, for example, materials containing as main component niobium, barium, and bismuth, and having a tungsten bronze structure.

"Japanese Journal of Applied Physics, 1987, Vol. 26, No. 5, p. 778 to 779" discloses a bismuth barium niobium oxide-based piezoelectric material. Further, Japanese Patent Application Laid-Open No. 2001-72466 discloses a material system containing as a main component barium lithium niobium oxide and as a sub-component bismuth niobium oxide.

However, in the material system disclosed in "Japanese Journal of Applied Physics, 1987, Vol. 26, No. 5, p. 778 to 779", there was a problem in that, if bismuth component increases, although piezoelectric properties become higher, a Curie temperature is lowered, thereby being not suitable for use in high temperature.

Further, even in a material system disclosed in Japanese Patent Application Laid-Open No. 2001-72466, there was a problem in that if bismuth component increases, the Curie temperature is lowered.

SUMMARY OF THE INVENTION

Technical Problem

The present invention has been accomplished in view of such background art, and provides a piezoelectric material, which is free from lead, has a high Curie temperature, and contains a bismuth barium niobium oxide-based tungsten bronze structure metal oxide.

The present invention also provides a piezoelectric device, a liquid discharge head, and an ultrasonic motor using the piezoelectric material.

Solution to Problem

The piezoelectric material for solving the above-mentioned problems is a piezoelectric material including a tungsten bronze structure metal oxide represented by the following general formula (1), in which the tungsten bronze structure metal oxide includes Li, and a content of the Li is 0.015 weight percent or more and 0.600 weight percent or less in terms of metal with respect to 100 parts by weight of the metal oxide:

$$A_xB_{10}O_{30} \tag{1}$$

where A represents Ba and Bi, or at least one kind of element selected from the group consisting of Na, Sr, and Ca in addition to Ba and Bi; B represents Nb, or Nb and Ta; and x represents a numerical value of $4.5<x<5.5$.

A piezoelectric device for solving the above-mentioned problems includes at least a first electrode, the piezoelectric material, and a second electrode.

A liquid discharge head for solving the above-mentioned problems is a liquid discharge head, which uses the piezoelectric device.

An ultrasonic motor for solving the above-mentioned problems is an ultrasonic motor, which uses the piezoelectric device.

Advantageous Effects of Invention

According to the present invention the piezoelectric material can be provided, which contains the bismuth barium niobium oxide-based metal oxide having a tungsten bronze structure having a high Curie temperature. In particular, the piezoelectric material having a Curie temperature of 150° C. or more can be provided. Further, as the present invention is free from lead, there can be provided the piezoelectric material which has low impact on the ecosystem. Moreover, the present invention can provide the piezoelectric device, the liquid discharge head, and the ultrasonic motor using the piezoelectric material, each having excellent durability.

DESCRIPTION OF EMBODIMENTS

Figure 1A:
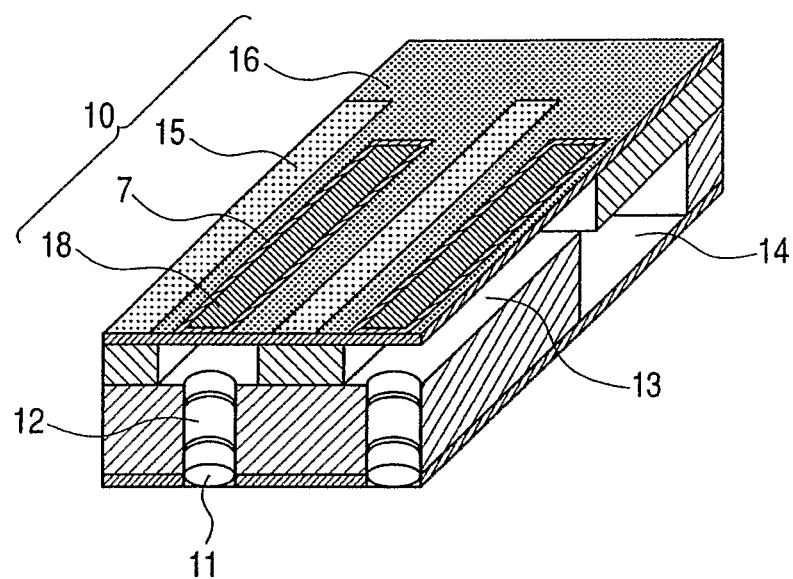
FIG. 1A is a schematic diagram illustrating a structure of a liquid discharge head according to one embodiment of the present invention.

Hereinafter, embodiments for carrying out the present invention are described.

A piezoelectric material according to the present invention includes a tungsten bronze structure metal oxide represented by the following general formula (1), in which the metal oxide having a tungsten bronze structure contains Li, and a content of the Li is 0.015 weight percent or more and 0.600 weight percent or less in terms of metal:

$$A_xB_{10}O_{30} \tag{1}$$

where A represents Ba and Bi, or at least one kind element selected from the group consisting of: Na, Sr, and Ca in addition to Ba and Bi; B represents Nb, or Nb and Ta; and x represents a numerical value of 4.5<x<5.5.

The piezoelectric material of the present invention is a lead-free piezoelectric material, which contains, in the general formula (1), a tungsten bronze structure metal oxide containing as main components A element containing Ba and Bi, or at least one kind of element selected from the group consisting of Na, Sr, and Ca in addition to Ba and Bi, and B element containing Nb, or Nb and Ta, and contains Li as a sub-component.

The tungsten bronze structure used herein does not designate $H_xWO_3$ (tungsten bronze) and a hexagonal tungsten bronze structure (Hexagonal Tungsten Bronze, HTB), known as their electrochromic phenomena, and designates a generally-known tetragonal tungsten bronze structure (Tetragonal Tungsten Bronze, TTB).

In the tungsten bronze structure metal oxide, the definition of a unit cell differs for the tetragonal crystal and the orthorhombic crystal. In this invention, when indicating crystallographic planes, crystallographic orientations, and diffraction, the definition for a unit cell of tetragonal is used.

The Curie temperature used herein also includes, in addition to a general definition indicating a temperature at which ferroelectricity is lost, a temperature at which a maximum dielectric constant is exhibited when the dielectric constant is measured while varying the measurement temperatures by using a minute alternating electric field having a particular frequency.

A mol % used herein refers to a content of substance of a specified element with respect to a total content of substance occupying a specified site by a percentage.

In general, a tungsten bronze structure metal oxide is represented by a chemical formula of $A_{4-6}B_{10}O_{30}$. In a unit cell of the tungsten bronze structure, Ba, Bi, Na, Sr, and Ca each mainly occupy any of two kinds of specific positions called an A1-site (12 coordination, and rectangular site viewed from c-axis direction) or an A2-site (15 coordination, and pentagonal site viewed from c-axis direction) which exist at the periphery of oxygen octahedron. The maximum value x which is the sum of the A1-site and the A2-site satisfies x=6, and hence the element having a number more than that can not occupy the A-site.

The element B in the general formula (1) mainly occupies a specific position called a B-site, and exists inside the octahedron. This site is selected from Nb or a combination of Nb and Ta. More preferred B is Nb. In a case where B is Nb, compared to a case in which B is Ta, Nb has a lower sintering temperature, and is inexpensive further.

Li which is a sub-component occupies holes in an A-site in order, and hence only in a case where the value of x satisfies x<6, Li can occupy the site. Preferred range of x is 4.5<x<5.5, and an increase in a Curie temperature is markedly exhibited through the addition of Li within the range.

To show the fact that Li occupies the A-site and does not occupy a grain boundary, there may be employed a calculation of the lattice constant of a sintered body or powders obtained by pulverizing the sintered body from X ray diffraction pattern thereof. If the Li occupies the A-site, to thereby occupy the holes, the repulsion of a local electric field generated from the A-site becomes larger, and the position of the B-site element is largely displaced from a center position of the oxygen octahedron. As a result, a-b plane is compressed, and the c axis length, which is a surface perpendicular direction, becomes longer. In other words, it is possible to know the existence or absence of Li in the A-site through the comparison of the lattice constants between a case of the main component alone without containing Li and a case of the component containing Li as a sub-component.

The piezoelectric material of the present invention preferably contains Li component of 0.015 weight percent or more and 0.600 weight percent or less, more preferably, 0.018 weight percent or more and 0.570 weight percent or less in terms of metal with respect to 100 weight percent of the tungsten bronze structure metal oxide represented by the general formula (1). If the content of Li component is less than 0.015 weight percent, there is such a possibility that c-axis length does not increase. Further, if the content exceeds 0.600 weight percent, there is a fear of generating impurity phases.

Note that, Li preferably occupies the A site, but may occupy a site other than the A-site. Further, the Li may be contained, in a form of $Li_2O$, or the like, in other portion than the sight.

The term "in terms of metal" refers to a numerical value (weight percent), which is determined by the ratio of Li content with respect to the total content of A and B in terms oxide by measuring from the contents of the respective metals of A, B, and Li measured from a tungsten bronze structure metal oxide by an X-ray fluorescence analysis, an ICP (Inductively Coupled Plasma) emission spectrometry analysis, an atomic absorption spectrometry, or the like.

The c-axis length of the piezoelectric material of the present invention is preferably longer than the c-axis length of the tungsten bronze structure metal oxide.

In the general formula (1), preferably the A contains Ba and Bi, and the B consists of Nb.

Further, preferably a molar ratio of Ba and Bi contained in the A is 5.7≤Ba/Bi≤6.3.

Further, preferably the A contains Ba, Bi, and Na, and the B consists of Nb.

Further, preferably the A contains Ca, Ba, Bi, and Na, and the B consists of Nb.

Further, preferably the molar ratio of Bi and Na contained in the A is 0.5≤Bi/Na≤1.5.

In addition, as the preferred piezoelectric material of the present invention, there is exemplified a tungsten bronze structure metal oxide represented by the above-mentioned general formula (1), which consists of a complex oxide represented by the following general formula (2):

$(Ba_a,Ca_b,Bi_c,Na_d)_5Nb_{10}O_{30}$     (2)

where a, b, c, and d each represent numerical values of 0.6≤a<0.85, 0≤b≤0.40, 0<c≤0.20, and 0≤d≤0.20, provided that a+b+c+d=1.

In the general formula (2), an ideal molar ratio of Bi:Na is 1:1. With respect to Bi, if Na is too excessive or in short, the excess Na may precipitate in grain boundary, or shortage may form a defect site, thereby generating oxygen defects and affecting, for example, on an insulation property. An allowable range of molar ratio of Na with respect to Bi is, for example, Bi/Na=0.5 or more and 1.5 or less. There is a fear of degrading not only the insulation property but also piezoelectric property, if the molar ratio does not fall within the range. More preferred is Bi/Na=0.9 or more and 1.1 or less.

Figure 3:
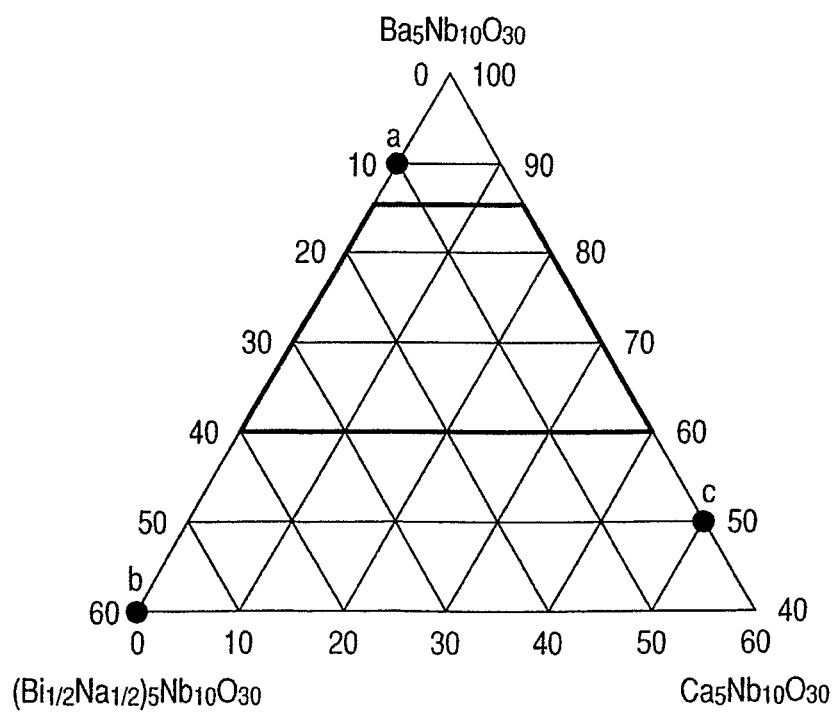
FIG. 3 is a phase diagram of a piezoelectric material of the present invention.

Next, referring to FIG. 3, description is made of a preferred composition of the piezoelectric material of the present invention. FIG. 3 is an example phase diagram of a piezoelectric material of the present invention. A point a (a, b, c, d)=(0.9, 0, 0.05, 0.05) of FIG. 3 is a composition which does not constitute a single phase of the tungsten bronze structure. $Ba_5Nb_{10}O_{30}$ does not take a tungsten bronze structure, and hence if the point a is in a range of a≥0.85, which is a state in which the component is too excessive, there is a possibility that the point a does not constitute a single phase of the tungsten bronze structure. A point b (a, b, c, d)=(0.4, 0, 0.3, 0.3) of FIG. 3 is a composition which does not exhibit a piezoelectric property at room temperature. As the Bi and Na contents increase, the piezoelectric property is enhanced, but a Curie temperature goes to a lower temperature. Further, if the Bi and Na contents are too excessive, the Curie temperature becomes room temperature or less in the ranges of c>0.20 and d>0.20. In order to secure the Curie temperature of 100° C., until which devices generally may endure, a fair amount of Li must be contained therein. As a result, a charge balance therein may collapse, resulting in a fear of being a cause of the degradation of insulation property. Further, there is a higher risk that the single phase of tungsten bronze structure may not be obtained. A point c (a, b, c, d)=(0.5, 0.5, 0, 0) of FIG. 3 has a composition which is hardly sintered. If a Ca content is increased, the sintered body is liable to cause an abnormal grain growth. The sintered body, in which the abnormal growth was taken place, is too large in grain size, thereby being liable to cause a crack. As a result, a breaking strength of the grain becomes extremely weaker, and hence there is a fear of being not suited to use for piezoelectric devices. From the facts described above, the range surrounded by a thick frame of FIG. 3 becomes a preferred composition range.

In order to facilitate the manufacture of the piezoelectric material of the present invention, and to adjust physical properties of the piezoelectric material of the present invention, an element other than Nb and Ta may be added to the B. As the element to be added to the B, a trivalent or tetravalent metal element is preferred. For example, there are exemplified Fe, Al, Co, Ti, and Zr. The content of the element to be added to the B is preferably 20 mol % or less of the B-site elements. Further preferred is 5 mol % or less. The reduction of total valence of the B-site elements may desirably be compensated by increasing the content of the A-site elements.

In order to facilitate the manufacture of the piezoelectric material of the present invention, and to adjust physical properties of the piezoelectric material of the present invention, an element such as V, Mo, or Co may be added thereto. The amount of the element to be added is preferably 10 mol % or less per mole of a tungsten bronze structure metal oxide. If the amount exceeding 10 mol % is added, there is a fear of generating impurity phases, or degrading the insulation property.

The manufacture of bulk ceramics of the piezoelectric material of the present invention can be carried out by a general method involving sintering under an ambient pressure an oxide of the metal constituting the piezoelectric material, powders manufactured using a material such as a nitrate or an oxalate, or a mold body formed by casting. Other than the above, there may be employed a method such as an electric heating method, a microwave sintering method, a millimeter wave sintering method, or a hot isostatic pressing method.

The bulk ceramics of the piezoelectric material of the present invention may be subjected to crystallographic orientation control. In order to obtain the bulk ceramics subjected to the crystallographic orientation control, there may employ a grain-orientation method using high magnetic field or crystallographic oriented grains. As materials, which can be used for the grain-orientation method, there are exemplified Bismuth layer-structured oxides, or tungsten bronze metal oxides.

The embodiment of the piezoelectric material of the present invention may be a single crystal, a sintered body, or a film formed on a substrate.

The grain size of the piezoelectric material of the present invention is favorable as large as possible when various grain-orientation methods are applied. However, if a crystal grain size exceeds 100 μm, there is a fear of being poor in strength at the time of cutting processing and polishing processing. Accordingly, a preferred range of the grain sizes is 0.3 μm or more and 100 μm or less in average grain size.

When the piezoelectric material of the present invention is used as a film formed on a substrate, the piezoelectric material preferably has a thickness of 200 nm or more and 10 μm or less, more preferably 300 nm or more and 3 μm or less. By setting the film thickness of the piezoelectric material to 200 nm or more and 10 μm or less, there can be obtained as the piezoelectric device a sufficient electrical mechanical conversion function, and there can also be expected to achieve a higher density piezoelectric device.

A stacking method for the above-mentioned films is not particularly limited. There are exemplified, for example, a chemical solution deposition method (CSD method), a sol-gel method, a metalorganic chemical vapor deposition (MOCVD method), a sputtering method, a pulse laser deposition method (PLD method), a hydrothermal synthesis method, and an aerosol deposition method (AD method). Of those, most preferred lamination method is a chemical solution deposition method or a sputtering method. By the chemical solution deposition method or the sputtering method, it is easily to achieve a large area.

It is preferred that a substrate to be used for the piezoelectric material of the present invention be a single-crystal substrate, which is selectively oriented in a (001) plane or a (111) plane.

Through the use of a single-crystal substrate oriented in a particular plane, a film-like piezoelectric material formed on the surface of the substrate can be strongly oriented in the same orientation. If the piezoelectric material is oriented in the (001) plane or a (100)/(010) plane, the moment of polarization is aligned in a direction perpendicular to the film, and hence the enhancement of the piezoelectric effect can be expected.

Hereinafter, description is made of a piezoelectric device using a piezoelectric material of the present invention.

The piezoelectric device according to the present invention is a piezoelectric device including at least a first electrode, the piezoelectric material, and a second electrode.

The liquid discharge head of the present invention is a liquid discharge head including the piezoelectric device. FIG. 1A is a schematic view of the liquid discharge head. The liquid discharge head includes an discharge port 11, a communication hole 12 communicating an individual liquid reservoir 13 and the eject port 11, a common liquid reservoir 14, an oscillation plate 15, and a piezoelectric device 10. As illustrated in FIG. 1A, the piezoelectric device 10 has a rectangular shape, but may be an elliptical shape, circular shape, parallelogrammic shape, and the like in stead of rectangular shape. In that case, generally, the piezoelectric material 7 also takes a shape along the shape of the individual liquid reservoir.

Figure 1B:
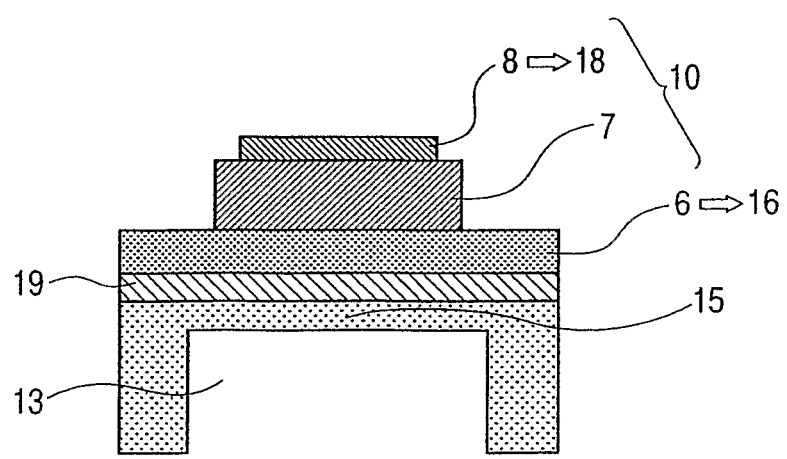
FIG. 1B is a schematic diagram illustrating a structure of a liquid discharge head according to one embodiment of the present invention.

The vicinity of the piezoelectric device 10 constituting the liquid discharge head according to the present invention is further described in detail with reference to FIG. 1B. FIG. 1B is a sectional view of the piezoelectric device in a width direction of the liquid discharge head of FIG. 1A. The sectional shape of the piezoelectric device 10 is represented as a rectangle. However, the sectional shape may be represented by a trapezoidal or reverse trapezoidal shape. Further, in FIG. 1B, a first electrode 6 corresponds to a lower electrode 16, and a second electrode 8 corresponds to an upper electrode 18.

However, a first electrode 6 and a second electrode 8 constituting the piezoelectric device of the present invention 10 each may be the lower electrode 16 and the upper electrode 18 or vice versa. Further, a buffer layer 19 may be interposed between a oscillation plate 15 and the lower electrode 16.

In the liquid discharge head, the oscillation plate oscillates vertically by expansion and contraction of the piezoelectric material, to thereby apply a pressure to the liquid in the individual liquid reservoir so as to eject the liquid from the discharge port. The liquid discharge head of the present invention can be used not only for a printer but also for manufacturing an electronic device.

Next, description is made of an ultrasonic motor that uses the piezoelectric device of the present invention. The ultrasonic motor of the present invention is an ultrasonic motor using the piezoelectric device.

Figure 2A:
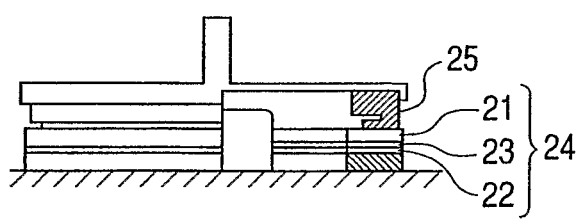
FIG. 2A is a schematic diagram illustrating a structure of an ultrasonic motor according to one embodiment of the present invention.

FIG. 2A is a diagram illustrating an embodiment of a structure of the ultrasonic motor in which the piezoelectric device of the present invention is formed of a single plate. The ultrasonic motor includes oscillator 24 in which a piezoelectric device 22 of the present invention is bonded to a metallic elastic ring 21 by an organic-based adhesive 23 (epoxy-based, cyanoacrylate-based, etc.), a rotor4 25 which is brought into contact with a sliding surface of the oscillator 24 by receiving a pressuring force with a pressure spring (not shown), and an output shaft integrally formed with the rotor 25.

If AC voltage is applied to the piezoelectric device of the present invention from a two-phase (having a phase difference of $\Pi/2$) power source, a bending traveling wave is generated in the oscillator 24. As a result, each point on the sliding surface of the oscillator 24 undergoes an elliptical movement. If the rotor 25 is brought into press-contact with the sliding surface of the oscillator 24, the rotor 25 receives a friction force from the oscillator 24, and rotates in the direction of the elliptical movement on the sliding surface of the oscillator 24. A member to be driven (not shown) is coupled to the output shaft 26 by a coupling or the like, and is driven by receiving a rotation force of the rotor 25. This type of motor utilizes such a principle that a piezoelectric device expands and contracts by piezoelectric lateral effect when a voltage is applied to the piezoelectric device, if the piezoelectric device is attached to an elastic element of a metal or the like, the elastic element can be bent.

Figure 2B:
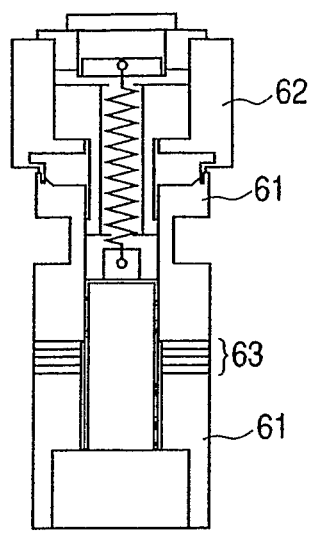
FIG. 2B is a schematic diagram illustrating a structure of an ultrasonic motor according to one embodiment of the present invention.

In addition, in FIG. 2B, there is exemplified an ultrasonic motor in which the piezoelectric device has a lamination structure. In FIG. 2B, a reference numeral 61 denotes a vibrator made of a metallic material, and a plurality of piezoelectric devices of the present invention 63 are interposed between cylindrical metal blocks. Those metal blocks are fastened with bolts, and the plurality of piezoelectric device 63 are sandwiched and fixed, thereby constituting the vibrator. Through the application of AC voltages having impurity phases to the piezoelectric member for driving the piezoelectric device, two vibrations, which are orthogonal to each other, are excited, and synthesis of the two oscillations forms a circular oscillation for driving at a top of the oscillator. It should be noted that, at an upper portion of the oscillator 61, there is formed a constricted peripheral groove so that the displacement of the oscillation for driving is made larger.

Reference numeral 62 denotes a rotor, and the rotor is constructed in pressure contact with the oscillator 61 with a spring S for pressurizing, to thereby obtain a friction force for driving. Further, the rotor 62 is rotatably supported with a bearing.

As described above, the piezoelectric device of the present invention is suitably used for the liquid discharge head or the ultrasonic motor. As the liquid discharge head, with the lead-free piezoelectric device including a tungsten bronze structure metal oxide, there can be provided a head having a nozzle density and an discharge force which is the same with lead-based or more. Further, as the ultrasonic motor, with the lead-free piezoelectric material including a tungsten bronze structure metal oxide, there can be provided a motor having a driving force and durability which are the same with the lead-based or more.

The piezoelectric material of the present invention can be used for devices, in addition to the liquid discharge head and the motor, such as an ultrasonic oscillator, a piezoelectric actuator, a piezoelectric sensor, and ferroelectric memory.

Hereinafter, the piezoelectric material of the present invention is specifically described by way of examples, but the present invention is not limited to the following examples.

EXAMPLES 1 TO 4

Example of $(Ba, Ca)_4Bi_{2/3}(Nb, Ta)_{10}O_{30}$

As the raw materials, barium carbonate, calcium carbonate, bismuth oxide, niobium oxide, tantalum oxide and lithium carbonate powder were used. The respective powders are subjected to weighing so as to obtain a target composition, and were mixed together. The mixed powders were calcined in air at 900° C. to 1100° C. for two to five hours. The calcined powders were pulverized, a binder is added thereto, and followed by granulation. The granulated powders were charged into a die, and were subjected to compression, to thereby produce a green compact. The green compact is sintered in air at 1000° C. to 1400° C. for two to six hours, and the sintered body is obtained thereby. The sintering temperature was lowered as the content of lithium carbonate was increased.

The obtained sintered body was subjected to surface-polishing into a thickness of about 1 mm. The polished sintered body, or the powders obtained by pulverizing the polished sintered body were used to conduct X-ray diffraction measurement. With this, an analysis of crystal phase and calculation of a lattice constant were carried out. Further, organic components on the surface were removed by heat-treating the sintered body in air at 550 to 1000° C. for one hour, and then gold electrodes were fabricated by DC sputtering on both front and back surfaces. After that, a sample was processed into a rectangular shape, and various electric characteristics thereof were evaluated.

(Evaluation Method)
(1) Composition of Sintered Body

The composition of the sintered body was determined by ICP emission spectrometry in terms of Ba, Bi, Ca, Nb, and Ta, and by atomic absorption spectrometry in terms of Li, respectively.

Li (weight percent) described in the following Examples are values determined by the above-mentioned method.

(2) Curie Temperature (Tc)

The temperature dependence of a dielectric constant is determined using a minute AC electric field having a frequency of 1 MHz, and its maximum value was defined as a Curie temperature (Tc)

(3) c-Axis Length

The c-axis length was determined by determining a d-value in (002) plane by X-ray diffraction pattern.

(4) Piezoelectric Property

The piezoelectric property was evaluated in terms of presence or absence of the piezoelectric property from the crystal structure by X-ray diffraction, and was evaluated combining the result of the Curie temperature, and a relative density measured by an Archimedes's method.

Symbols representing evaluations are as follows:

"○" represents that the sample has the piezoelectric property, and as the sample contains Li, the Curie temperature is risen, and the relative density is 97% or more;

"Δ" represents that the sample has the piezoelectric property," but even though Li was contained, the Curie temperature did not rise, or the relative density was less than 97%;

"x" represents that sample does not have the piezoelectric property, or the impurity phase exists, thereby being not able to evaluate.

TABLE 1

|  | Ba | Bi | Ca | x | Nb | Ta | Li [weight percent] | Tc [° C.] | c [nm] | piezoelectric property |
|---|---|---|---|---|---|---|---|---|---|---|
| Example 1 | 4 | 2/3 | 0 | 14/3 | 10 | 0 | 0.094 | 320 | 0.3986 | ○ |
| Example 2 | 4 | 2/3 | 0 | 14/3 | 10 | 0 | 0.188 | 380 | 0.3992 | ○ |
| Example 3 | 3 | 2/3 | 1 | 14/3 | 10 | 0 | 0.094 | 280 | 0.3985 | ○ |
| Example 4 | 4 | 2/3 | 0 | 14/3 | 9.5 | 0.5 | 0.094 | 290 | 0.3986 | ○ |
| Comparative Example 1 | 4 | 2/3 | 0 | 14/3 | 10 | 0 | 0.000 | 240 | 0.3982 | Δ |
| Comparative Example 2 | 3 | 2/3 | 1 | 14/3 | 10 | 0 | 0.000 | 220 | 0.3982 | Δ |
| Comparative Example 3 | 4 | 2/3 | 0 | 14/3 | 9.5 | 0.5 | 0.000 | 210 | 0.3982 | Δ |

From Table 1, it is found that in the samples containing Li, the Curie temperature of the sintered body is risen by 60° C. to 140° C. compared to the samples which do not contain Li. For example, it is found that in the piezoelectric sample of Example 3, which is obtained by containing an appropriate amount of Li into the piezoelectric sample of Example 2, the Curie temperature is risen by 60° C.

Further, it is also found that as the sample contains Li, the c-axis length of the sintered body is increased by 0.08% to 0.25% compared to the sample which does not contain Li. That is, Li enters into the lattice of tungsten bronze structure, and the c-axis length was increased, with the result that the Curie temperature was risen.

EXAMPLES 5 TO 18

Example of $(Ba, Bi, Na)_x Nb_{10} O_{30}$

As the materials, barium carbonate, bismuth oxide, sodium carbonate, niobium oxide and lithium carbonate powder were used. The respective powders are subjected to weighing so as to obtain a target composition, and were mixed together. The mixed powders were calcined in air at 900° C. to 1100° C. for two to five hours. The calcined powders were pulverized, a binder is added thereto, and followed by granulation. The granulated powders were charged into a die, and were subjected to compression, to thereby produce a green compact. The green compact is sintered in air at 1000° C. to 1400° C. for two to six hours, and the sintered body is obtained thereby. The sintering temperature was lowered as the contents of lithium carbonate and sodium carbonate were increased. The obtained sintered body was subjected to polishing, processing, and evaluation in the same manner as in Examples 1 to 4. The results thereof are shown in Table 2.

The composition of the sintered body was determined by ICP emission spectrometry in terms of Ba, Bi, and Nb, and by atomic absorption spectrometry in terms of Na and Li, respectively.

TABLE 2

|  | Ba | Bi | Na | x | Nb | Li [weight percent] | Tc [° C.] | c [nm] | piezoelectric property |
|---|---|---|---|---|---|---|---|---|---|
| Example 5 | 3.8 | 0.72 | 0.78 | 5.3 | 10 | 0.100 | 380 | 0.3982 | ○ |
| Example 6 | 4 | 0.5 | 0.5 | 5 | 10 | 0.094 | 410 | 0.3972 | ○ |
| Example 7 | 3.75 | 0.635 | 0.59 | 4.975 | 10 | 0.116 | 300 | 0.3973 | ○ |
| Example 8 | 3.75 | 0.625 | 0.625 | 5 | 10 | 0.019 | 200 | 0.3974 | ○ |
| Example 9 | 3.75 | 0.625 | 0.625 | 5 | 10 | 0.056 | 260 | 0.3976 | ○ |
| Example 10 | 3.75 | 0.625 | 0.625 | 5 | 10 | 0.094 | 280 | 0.3979 | ○ |
| Example 11 | 3.75 | 0.625 | 0.625 | 5 | 10 | 0.132 | 320 | 0.3982 | ○ |
| Example 12 | 3.75 | 0.625 | 0.625 | 5 | 10 | 0.188 | 390 | 0.3985 | ○ |
| Example 13 | 3.75 | 0.625 | 0.625 | 5 | 10 | 0.244 | 380 | 0.3987 | ○ |
| Example 14 | 3.75 | 0.625 | 0.625 | 5 | 10 | 0.319 | 440 | 0.3990 | ○ |
| Example 15 | 3.75 | 0.625 | 0.625 | 5 | 10 | 0.376 | 460 | 0.3992 | ○ |
| Example 16 | 3.75 | 0.625 | 0.625 | 5 | 10 | 0.564 | 480 | 0.3993 | ○ |
| Example 17 | 3.5 | 0.75 | 0.75 | 5 | 10 | 0.188 | 270 | 0.3973 | ○ |
| Example 18 | 3 | 1 | 1 | 5 | 10 | 0.244 | 240 | 0.3972 | ○ |
| Comparative Example 4 | 4.25 | 3.75 | 0.375 | 5 | 10 | 0.000 | x | — | x |
| Comparative Example 5 | 3.8 | 0.38 | 0.82 | 5 | 10 | 0.000 | x | — | x |
| Comparative Example 6 | 3.8 | 0.72 | 0.78 | 5.3 | 10 | 0.000 | 260 | 0.3968 | Δ |
| Comparative Example 7 | 4 | 0.5 | 0.5 | 5 | 10 | 0.000 | 300 | 0.3967 | Δ |
| Comparative Example 8 | 3.75 | 0.635 | 0.59 | 4.975 | 10 | 0.000 | 190 | 0.3967 | Δ |
| Comparative Example 9 | 3.75 | 0.625 | 0.625 | 5 | 10 | 0.000 | 190 | 0.3967 | Δ |
| Comparative Example 10 | 3.75 | 0.625 | 0.625 | 5 | 10 | 0.939 | x | — | x |

TABLE 2-continued

|  | Ba | Bi | Na | x | Nb | Li [weight percent] | Tc [° C.] | c [nm] | piezoelectric property |
|---|---|---|---|---|---|---|---|---|---|
| Comparative Example 11 | 3.75 | 0.8 | 0.45 | 5 | 10 | 0.950 | x | — | x |
| Comparative Example 12 | 3.5 | 0.75 | 0.75 | 5 | 10 | 0.000 | 70 | 0.3967 | Δ |
| Comparative Example 13 | 3 | 1 | 1 | 5 | 10 | 0.000 | 40 | 0.3967 | Δ |
| Comparative Example 14 | 2 | 1.5 | 1.5 | 5 | 10 | 0.000 | x | 0.3967 | x |

From Table 2, as in Examples 1 to 4, it is found that as the sample contains Li, the c-axis length of the sintered body is increased, and the Curie temperature is risen. In Table 2, the sample marked as "x" in the Curie temperature is a sample in which an X-ray diffraction pattern different from the tungsten bronze structure was observed when the evaluation of the crystal phase was conducted by X-ray diffraction. With respect to those samples, the evaluation of the Curie temperature, and recognition as to "with or without the piezoelectric property" did not carried out.

Figure 4:
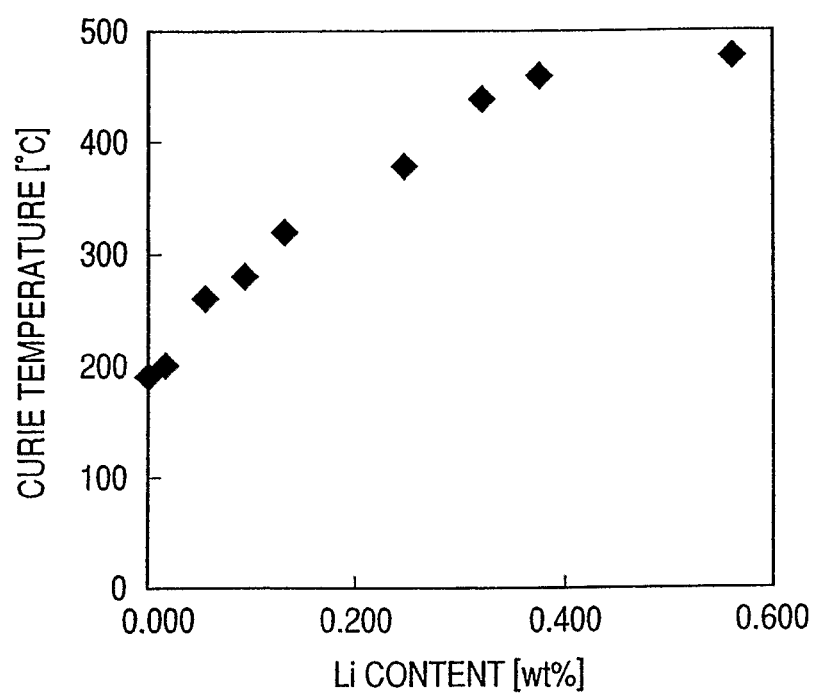
FIG. 4 is a graph showing a relationship between an Li content in terms of metal and a Curie temperature of the piezoelectric material when a complex oxide of the piezoelectric material is $(Ba_{0.75}, Bi_{0.125}, Na_{0.125})_5Nb_{10}O_{30}$.

The results obtained from Comparative Example 9 and Examples 8 to 16 are shown in FIG. 4. FIG. 4 shows a relationship between the content of sub-component Li when the main component is $(Ba_{0.75}, Bi_{0.125}, Na_{0.125})_5Nb_{10}O_{30}$, and the Curie temperature of the piezoelectric material. As shown in FIG. 4, it is found that as the Li content increases, the Curie temperature increases. Further, in Comparative Example 10, in which the main component is the same, as the material contains 0.939 weight percent of Li being extremely excessive, a different phase was generated. With this result, it was found that the content of Li from 0.019 weight percent to 0.564 weight percent has an effect of rising the Curie temperature.

EXAMPLES 19 TO 21

Example of $(Ba, Bi, Na)_5(Nb, Ta)_{10}O_{30}$

As the materials, barium carbonate, bismuth oxide, sodium carbonate, niobium oxide, tantalum oxide and lithium carbonate powder were used. The respective powders are subjected to weighing so as to obtain a target composition, and were mixed together. The mixed powders were calcined in air at 900° C. to 1100° C. for two to five hours. The calcined powders were pulverized, a binder is added thereto, and followed by granulation. The granulated powders were charged into a die, and were subjected to compression, to thereby produce a green compact. The green compact is sintered in air at 1000° C. to 1400° C. for two to six hours, and the sintered body is obtained thereby. The sintering temperature was lowered as the contents of lithium carbonate and sodium carbonate were increased, and the sintering temperature was raised as the content of tantalum oxide increases. The obtained sintered body was subjected to polishing, processing, and evaluation in the same manner as in Examples 1 to 18. The results thereof are shown in Table 3.

The composition of the sintered body was determined by ICP emission spectrometry in terms of Ba, Bi, Nb, and Ta, and by atomic absorption spectrometry in terms of Na and Li, respectively.

TABLE 3

|  | Ba | Bi | Na | x | Nb | Ta | Li [weight percent] | Tc [° C.] | c [nm] | piezoelectric property |
|---|---|---|---|---|---|---|---|---|---|---|
| Example 19 | 3.75 | 0.625 | 0.625 | 5 | 9.5 | 0.5 | 0.094 | 200 | 0.3971 | ○ |
| Example 20 | 3.75 | 0.625 | 0.625 | 5 | 9 | 1 | 0.094 | 180 | 0.3973 | ○ |
| Example 21 | 3.75 | 0.625 | 0.625 | 5 | 8 | 2 | 0.100 | 160 | 0.3972 | ○ |
| Comparative Example 15 | 3.75 | 0.625 | 0.625 | 5 | 9.5 | 0.5 | 0.000 | 170 | 0.3967 | Δ |
| Comparative Example 16 | 3.75 | 0.625 | 0.625 | 5 | 9 | 1 | 0.000 | 150 | 0.3967 | Δ |
| Comparative Example 17 | 3.75 | 0.625 | 0.625 | 5 | 8 | 2 | 0.000 | 120 | 0.3967 | Δ |

From Table 3, as in Examples 1 to 18, it is found that as the sample contains Li, the c-axis length of the sintered body is increased, and the Curie temperature is risen. It is found that a material system containing Ta at the B-site has a slightly lower Curie temperature compared to a material system containing Nb only at the B-site. However, by containing the Li into the sample, 160° C. or more of the Curie temperature could be secured.

EXAMPLES 22 TO 24

Example of $(Ba, Ca, Bi, Na)_5Nb_{10}O_{30}$

As the materials, barium carbonate, calcium carbonate, bismuth oxide, sodium carbonate, niobium oxide and lithium carbonate powder were used. The respective powders are subjected to weighing so as to obtain a target composition, and were mixed together. The mixed powders were calcined in air at 900° C. to 1100° C. for two to five hours. The calcined powders were pulverized, a binder is added thereto, and followed by granulation. The granulated powders were charged into a die, and were subjected to compression, to thereby produce a green compact. The green compact is sintered in air at 1000° C. to 1400° C. for two to six hours, and the sintered body is obtained thereby. The sintering temperature was lowered as the contents of lithium carbonate and sodium carbonate were increased. The obtained sintered body was subjected to polishing, processing, and evaluation in the same manner as in Examples 1. The results thereof are shown in Table 4.

The composition of the sintered body was determined by ICP emission spectrometry in terms of Ba, Ca, Bi, and Nb, and by atomic absorption spectrometry in terms of Na and Li, respectively.

TABLE 4

| | Ba | Bi | Na | Ca | x | Nb | Li [weight percent] | Tc [° C.] | c [nm] | piezoelectric property |
|---|---|---|---|---|---|---|---|---|---|---|
| Example 22 | 3.75 | 0.5 | 0.5 | 0.25 | 5 | 10 | 0.094 | 240 | 0.3972 | ○ |
| Example 23 | 4 | 0.25 | 0.25 | 0.5 | 5 | 10 | 0.094 | 410 | 0.3972 | ○ |
| Example 24 | 3 | 0.125 | 0.125 | 1.75 | 5 | 10 | 0.047 | 280 | 0.3972 | ○ |
| Comparative Example 18 | 3.75 | 0.5 | 0.5 | 0.25 | 5 | 10 | 0.000 | 190 | 0.3967 | Δ |
| Comparative Example 19 | 4 | 0.25 | 0.25 | 0.5 | 5 | 10 | 0.000 | 310 | 0.3967 | Δ |
| Comparative Example 20 | 3 | 0.125 | 0.125 | 1.75 | 5 | 10 | 0.000 | 230 | 0.3967 | Δ |

From Table 4, as in Examples 1 to 21, it is found that as the sample contains Li, the c-axis length of the sintered body is increased, and the Curie temperature is risen. If Ca is contained in the A-site, an abnormal grain growth is liable to cause, but by adopting a proper sintering temperature, the abnormal grain growth was not observed in all of the samples.

EXAMPLES 25 TO 29

Example of $(Ba, Sr, Bi, Na)_xNb_{10}O_{30}$

As the materials, barium carbonate, strontium carbonate, bismuth oxide, niobium oxide and lithium carbonate powder were used. The respective powders are subjected to weighing so as to obtain a target composition, and were mixed together. The mixed powders were calcined in air at 900° C. to 1100° C. for two to five hours. The calcined powders were pulverized, a binder is added thereto, and followed by granulation. The granulated powders were charged into a die, and were subjected to compression, to thereby produce a green compact. The green compact is sintered in air at 1000° C. to 1400° C. for two to six hours, and the sintered body is obtained thereby. The sintering temperature was lowered as the contents of lithium carbonate and sodium carbonate were increased. The obtained sintered body was subjected to polishing, processing, and evaluation in the same manner as in Examples 1 to 24. The results thereof are shown in Table 5.

The composition of the sintered body was determined by ICP emission spectrometry in terms of Ba, Sr, Bi, and Nb, and by atomic absorption spectrometry in terms of Na and Li, respectively.

From Table 5, as in Examples 1 to 24, it is found that as the sample contains Li, the c-axis length of the sintered body is increased, and the Curie temperature is risen. In Examples 25 and 26, the value x was shifted from 5, but remarkable differences in looks and characteristics were not observed from the sample in which x=5.

COMPARATIVE EXAMPLES 26 TO 29

Example of $(Ba, Sr)_6Ti_2Nb_8O_{30}$

As the materials, barium carbonate, strontium carbonate, titanium oxide, niobium oxide and lithium carbonate powder were used. The respective powders are subjected to weighing so as to obtain a target composition, and were mixed together. The mixed powders were calcined in air at 900° C. to 1100° C. for two to five hours. The calcined powders were pulverized, a binder is added thereto, and followed by granulation. The granulated powders were charged into a die, and were subjected to compression, to thereby produce a green compact. The green compact is sintered in air at 1000° C. to 1400° C. for two to six hours, and the sintered body is obtained thereby. The sintering temperature was lowered for the samples that contain lithium carbonate. The obtained sintered body was subjected to polishing, processing, and evaluation in the same manner as in Examples 1 to 29. The results thereof are shown in Table 6.

The composition of the sintered body was determined by ICP emission spectrometry in terms of Ba, Sr, Nb, and Ti, and by atomic absorption spectrometry in terms of Li, respectively.

TABLE 5

| | Ba | Bi | Na | Sr | x | Nb | Li [weight percent] | Tc [° C.] | c [nm] | piezoelectric property |
|---|---|---|---|---|---|---|---|---|---|---|
| Example 25 | 4 | 0.24 | 0.24 | 0.5 | 4.98 | 10 | 0.094 | 350 | 0.3973 | ○ |
| Example 26 | 4 | 0.377 | 0.376 | 0.25 | 5.03 | 10 | 0.094 | 350 | 0.3973 | ○ |
| Example 27 | 3.75 | 0.5 | 0.5 | 0.25 | 5 | 10 | 0.094 | 250 | 0.3972 | ○ |
| Example 28 | 3.75 | 0.375 | 0.375 | 0.5 | 5 | 10 | 0.094 | 270 | 0.3973 | ○ |
| Example 29 | 3 | 0.125 | 0.125 | 1.5 | 5 | 10 | 0.047 | 240 | 0.3973 | ○ |
| Comparative Example 21 | 4 | 0.24 | 0.24 | 0.5 | 4.98 | 10 | 0.000 | 290 | 0.3967 | Δ |
| Comparative Example 22 | 4 | 0.377 | 0.376 | 0.25 | 5.03 | 10 | 0.000 | 290 | 0.3967 | Δ |
| Comparative Example 23 | 3.75 | 0.5 | 0.5 | 0.25 | 5 | 10 | 0.000 | 180 | 0.3967 | Δ |
| Comparative Example 24 | 3.75 | 0.375 | 0.375 | 0.5 | 5 | 10 | 0.000 | 210 | 0.3967 | Δ |
| Comparative Example 25 | 3 | 0.125 | 0.125 | 1.5 | 5 | 10 | 0.047 | 190 | 0.3967 | Δ |

TABLE 6

| | Ba | Sr | x | Nb | Ti | Li [weight percent] | Tc [°C.] | c [nm] | piezoelectric property |
|---|---|---|---|---|---|---|---|---|---|
| Comparative Example 26 | 3 | 3 | 6 | 8 | 2 | 0.000 | 120 | 0.3992 | Δ |
| Comparative Example 27 | 4.2 | 1.8 | 6 | 8 | 2 | 0.000 | 80 | 0.4017 | Δ |
| Comparative Example 28 | 3 | 3 | 6 | 8 | 2 | 0.094 | 90 | 0.3992 | Δ |
| Comparative Example 29 | 4.2 | 1.8 | 6 | 8 | 2 | 0.094 | 70 | 0.4017 | Δ |

From Table 6, it is found that, in $(Ba, Sr)_6Ti_2Nb_8O_{30}$ system, even if the sample contains Li, the Curie temperature of the sintered body was not risen. Further, it is found that, even if the sample contains Li, the c-axis length of the sintered body is not changed. In other words, it is thought that Li does not enter into the lattice of tungsten bronze structure.

It is thought that this is because $(Ba, Sr)_6Ti_2Nb_8O_{30}$ takes such a structure that, in the general formula (1), there exists no hole at the A-site of x=6. Therefore, Li can not occupy the site, and functions only as a sintering aid, thereby being remained in grain boundary. As a result, it is thought that even if the sample contains Li, the lattice length of the unit lattice does not change, and hence the Curie temperature is not risen.

From the results described above, it was found that, in the general formula (1), if Li is contained into the piezoelectric material of the metal oxide having a tungsten bronze structure in which the value x satisfies x<5.5, the Curie temperature of the piezoelectric material is risen.

EXAMPLE 30

The piezoelectric material, which is obtained by containing 0.019 weight percent of Li into $(Ba_{0.75}, Bi_{0.125}, Na_{0.125})_5 Nb_{10}O_{30}$ having the same composition with Example 8, was used to carry out an experimental manufacture of the liquid discharge head and the ultrasonic motor, which are illustrated in FIGS. 1A and 1B and FIGS. 2A and 2B. Both the liquid discharge head and the ultrasonic motor had a satisfactory characteristic.

INDUSTRIAL APPLICABILITY

The piezoelectric material of the present invention exhibits satisfactory piezoelectricity even at high ambient temperatures, and causes less load to environment, thereby being capable of being used without problems for equipment that uses a number of the piezoelectric materials, such as the liquid discharge head, the ultrasonic motor, and the piezoelectric device, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-228408, filed Sep. 30, 2009, which is hereby incorporated by reference herein in its entirety.

The invention claimed is:

1. A piezoelectric material comprising a tungsten bronze structure metal oxide represented by the following general formula (1), wherein the tungsten bronze structure metal oxide includes Li, and a content of the Li is 0.015 weight percent or more and 0.600 weight percent or less in terms of metal with respect to 100 parts by weight of the tungsten bronze structure metal oxide:

$$A_xB_{10}O_{30} \qquad (1)$$

where A represents Ba and Bi, or at least one kind or more of elements selected from the group consisting of Na, Sr, and Ca, in addition to Ba and Bi, B represents Nb, or Nb and Ta, and x represents a numerical value of 4.5<x<5.5.

2. The piezoelectric material according to claim 1, wherein a c-axis length of the piezoelectric material is larger than a c-axis length of the tungsten bronze structure metal oxide.

3. The piezoelectric material according to claim 1, wherein the A comprises Ba and Bi, and the B consists of Nb.

4. The piezoelectric material according to claim 1, wherein a molar ratio of Ba and Bi included in the A is 5.7≤Ba/Bi≤6.3.

5. The piezoelectric material according to claim 1, wherein the A comprises Ba, Bi, and Na, and the B consists of Nb.

6. The piezoelectric material according to claim 1, wherein the A comprises Ca, Ba, Bi and Na, and the B consists of Nb.

7. The piezoelectric material according to claim 5, wherein a molar ratio of Bi and Na included in the A is 0.5≤Bi/Na≤1.5.

8. The piezoelectric material according to claim 1, wherein the tungsten bronze structure metal oxide represented by general formula (1) comprises a complex oxide represented by the following general formula (2):

$$(Ba_a,Ca_b,Bi_c,Na_d)_5Nb_{10}O_{30} \qquad (2)$$

where a, b, c, and d each represent numerical values of 0.6≤a<0.85, 0≤b≤0.40, 0<c≤0.20, and 0≤d≤0.20, provided that a+b+c+d=1.

9. A piezoelectric device comprising a first electrode, a piezoelectric material, and a second electrode, wherein the piezoelectric material comprises the piezoelectric material according to claim 1.

10. A liquid discharge head, which uses the piezoelectric device according to claim 9.

11. An ultrasonic motor, which uses the piezoelectric device according to claim 9.

* * * * *